United States Patent
Nakamura (10) Patent No.: US 6,501,323 B2
(45) Date of Patent: Dec. 31, 2002

(54) VOLTAGE SWITCHING CIRCUIT

(75) Inventor: Hiroshi Nakamura, Fujisawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 09/983,952

(22) Filed: Oct. 26, 2001

(65) Prior Publication Data

US 2002/0050850 A1 May 2, 2002

(30) Foreign Application Priority Data

Oct. 30, 2000 (JP) ........................................ 2000-330973
Oct. 4, 2001 (JP) ........................................ 2001-308693

(51) Int. Cl.[7] .............................................. H03K 17/00
(52) U.S. Cl. ...................................... 327/365; 327/373
(58) Field of Search ................................ 327/365, 373, 327/374–384, 389, 396, 427, 434, 437, 567, 534, 537; 257/402, 392

(56) References Cited

U.S. PATENT DOCUMENTS 4,716,307 A * 12/1987 Aoyama ...................... 323/281
5,541,549 A * 7/1996 Kubota ........................ 327/117
6,215,348 B1 * 4/2001 Steensgaard-Madsen .... 327/390
6,307,420 B1 * 10/2001 Zhou .......................... 327/390

FOREIGN PATENT DOCUMENTS

JP          5-259473          10/1993

* cited by examiner

Primary Examiner—My-Trang Nu Ton
(74) Attorney, Agent, or Firm—Banner & Witcoff, LTD.

(57) ABSTRACT

A voltage switching circuit is disclosed which is constructed from a minimum number of transistors and prevents the threshold voltage margin from being lowered by causing high-voltage cutoff and supply voltage transfer functions heretofore performed by a single depletion transistor to be shared between two series-connected depletion transistors different in gate insulating film thickness or threshold voltage. Thus, without using enhancement transistors which involve an increase in pattern area a voltage switching circuit can be provided which is small in chip area, low in cost and high in yield and reliability and provides a stable operation with a low supply voltage which is impossible with one depletion transistor.

25 Claims, 7 Drawing Sheets

VOLTAGE SWITCHING CIRCUIT

CROSS-REFERENCE TO RELATED APPLICATIONS

This application is based upon and claims the benefit of priority from the prior Japanese Patent Applications No. 2000-330973, filed Oct. 30, 2000; and No. 2001-308693, filed Oct. 4, 2001, the entire contents of both of which are incorporated herein by reference.

BACKGROUND OF THE INVENTION

1. Field of the Invention

The present invention relates to a voltage switching circuit and more specifically to a voltage switching circuit for use in non-volatile semiconductor devices that utilize a voltage higher than supply voltages for NAND cells, NOR cells, DINOR cells, or AND cells.

2. Description of the Related Art

Devices that use a boosted voltage higher than a supply voltage, typically non-volatile semiconductor devices, need a circuit that allows one interconnect line to charge selectively to ground voltage, a supply voltage Vcc, or a high voltage more than the supply voltage. An example of a conventional voltage switching circuit having such a function is illustrated in FIG. 1.

Figure 1:
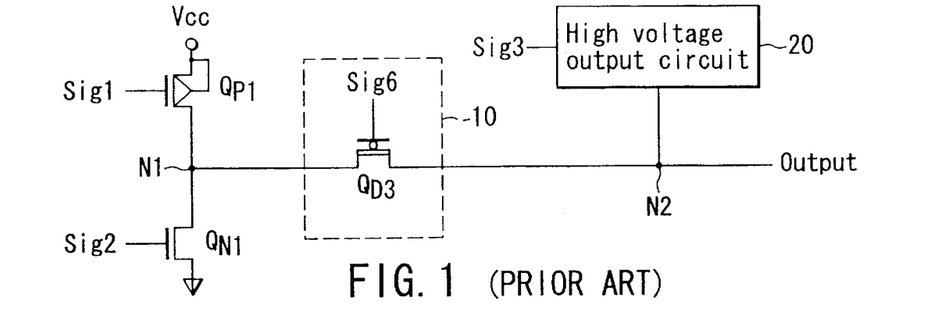
FIG. 1 shows the arrangement of a conventional voltage switching circuit using a depletion transistor.

The voltage switching circuit of FIG. 1 comprises a first circuit consisting of a P-channel transistor $Q_{P1}$ and an N-channel transistor $Q_{N1}$ which are enhancement-mode devices and connected together at a node N1, a second circuit, or a high voltage output circuit, connected to an output node N2, and a third circuit consisting of an N-channel transistor $Q_{D3}$ which is a depletion-mode device having a thick gate insulating film and connected between the nodes N1 and N2. The thick gate insulating film of the transistor $Q_{D3}$ is intended to withstand a high voltage output from the high-voltage output circuit 20 to the drain side of $Q_{D3}$.

In the first circuit, the transistor $Q_{P1}$ has its source and substrate connected together to the supply voltage Vcc, its gate connected to receive a signal Sig1, and its drain connected to the node N1, while the transistor $Q_{N1}$ has its source connected to ground (0 V), its gate connected to receive a signal Sig2, and its drain connected to the node N1.

In the second circuit, or the high voltage output circuit 20, a signal Sig3 is input and a high voltage $V_{PP}$ is output to the node N2. The high voltage $V_{PP}$ is used as a program voltage for a non-volatile semiconductor device.

In the third circuit, the transistor $Q_{D3}$ has its source connected to the node N1, its gate connected to receive a signal Sig6, and its drain connected to the node N2. The third circuit consisting of $Q_{D3}$ is closely related to the main part of the voltage switching circuit of the present invention as will be shown later and is therefore particularly indicated enclosed by broken line 10.

The operation of the voltage switching circuit shown in FIG. 1 will be described next. The signals Sig1, Sig2, Sig3 and Sig6 are set to go from Vcc (high level) to 0 volts (low level) or vice versa. In some cases, the signal Sig6 can take a voltage # higher than 0 volts as its high level.

In the first circuit, when both the signals Sig1 and Sig2 go high, $Q_{P1}$ turns off and $Q_{N1}$ turns on, causing the node N1 to go to 0 volts. On the other hand, when the signals Sig1 and Sig2 go low, $Q_{P1}$ turns on and $Q_{N1}$ turns off, so that the node N1 goes to Vcc. When the signal Sig1 goes high and the signal Sig2 goes low, both $Q_{P1}$ and $Q_{N1}$ turn off, so that the node N1 is placed in the floating (high impedance) state. In this manner, 0 volts, Vcc or high-impedance state can be output to the node N1 through the use of the signals Sig1 and Sig2.

In the second circuit, when the input signal Sig3 to the high-voltage output circuit 20 is raised to the high level, a high voltage $V_{PP}$ is output to the node N2. On the other hand, when the signal Sig3 goes low, the node N2 is placed in the high-impedance state.

In the third circuit, when the signal Sig6 goes high, the transistor $Q_{D3}$ turns on, so that the path between the nodes N1 and N2 is rendered conductive. When the signal Sig6 goes low, the transistor $Q_{D3}$ goes into the nonconductive state, causing the path between the nodes N1 and N2 to be cutoff.

Although the operation of each of the first, second and third circuits has been described separately, the correspondence between the levels of the signals Sig1, Sig2, Sig3 and Sig6 and the output voltages of the conventional voltage switching circuit can be represented as follows:

(a) [Vcc, 0V, 0V, #]=>[no output voltage (high-impedance state)]

(b) [Vcc, Vcc, 0V, #]=>[output voltage=0V]

(c) [0V, 0V, 0V, Vcc]=>[output voltage=Vcc]

(d) [0V, 0V, Vcc, 0V]=>[output voltage=$V_{PP}$]

The voltages within [ ] correspond to Sig1, Sig2, Sig3, and Sig6, respectively. In the case of (a) and (b), the voltage level # of Sig6 has only to be higher than 0 volts.

The feature of the voltage switching circuit shown in FIG. 1 is the provision of the depletion transistor $Q_{D3}$ between the output node N2 to which the high voltage $V_{PP}$ is output and the node N1 to which voltages of Vcc or less are applied. The implementation of cutoff of the path between the nodes N1 and N2 through a single transistor allows the circuit pattern area to be reduced.

Figure 2A:
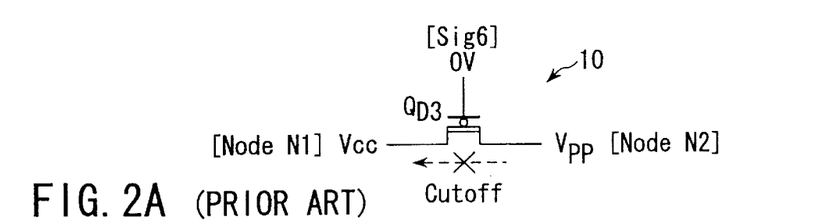
FIG. 2A is a diagram for use in explanation of the cutoff state of the third circuit in the voltage switching circuit of FIG. 1.
Figure 2B:
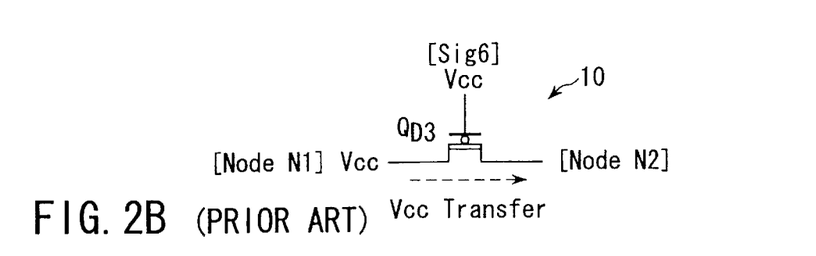
FIG. 2B is a diagram for use in explanation of the Vcc transfer state of the third circuit in the voltage switching circuit of FIG. 1.

In FIGS. 2A and 2B there is illustrated the operation of the third circuit 10. As described previously, in order for the voltage switching circuit to output desired voltages, the transistor $Q_{D3}$ is required to display such characteristics as indicated by dotted arrows in FIGS. 2A and 2B.

Assume here that the gate voltage of $Q_{D3}$ is Vg, the source voltage is Vs, and the drain voltage is Vd. Then, Vg corresponds to the voltage of Sig6, Vs to the voltage at the node N1, and Vd to the voltage at the node N2. As shown in FIG. 2A, therefore, the transistor $Q_{D3}$ should be rendered nonconductive when [Vg, Vs, Vd]=[0V, Vcc, $V_{PP}$] and, as shown in FIG. 2B, the source supply voltage Vcc should be transferred to the drain when [Vg, Vs]=[Vcc, Vcc].

When the cutoff characteristic of $Q_{D3}$ shown in FIG. 2A is obtained, leakage current associated with high voltage $V_{PP}$ will flow from the drain to the source, resulting in the $V_{PP}$ level dropping. When the conductive characteristic of $Q_{D3}$ shown in FIG. 2B is not obtained, the output voltage Vcc of the voltage switching circuit is lowered.

In general, when Vcc is high, (Vg−Vs)=−Vcc in FIG. 2A increases in the negative direction and as a result the margin for the cutoff characteristic of $Q_{D3}$ increases, allowing the absolute value of the threshold voltage (a negative value) of the transistor $Q_{D3}$ to be increased. For this reason, the Vcc transfer state (on state) shown in FIG. 2B can be achieved with a sufficient margin. However, in order to achieve the cutoff characteristic of FIG. 2A with Vcc decreased, it is required to decrease the absolute value of the threshold voltage of $Q_{D3}$. Thus, the margin for the threshold voltage of $Q_{D3}$ for the Vcc transfer state decreases with decreasing Vcc.

That is, in FIG. 2A, Vg−Vs (0V−Vcc=−Vcc) required to turn off the depletion transistor $Q_{D3}$ approaches 0 volts with decreasing Vcc, which requires the threshold voltage of $Q_{D3}$ to be set close to 0 volts to cut off the third circuit 10. Therefore, the margin for the Vcc transfer state decreases.

In recent years, with decreasing power dissipation of semiconductor integrated circuits, the supply voltage used has been increasingly lowered, which involves difficulties in satisfying the characteristics of the n-channel depletion transistor $Q_{D3}$ shown in FIGS. 2A and 2B. For this reason, such circuits as shown in FIGS. 3 and 4 have come into use which involve many components instead of using a depletion transistor.

Figure 3:
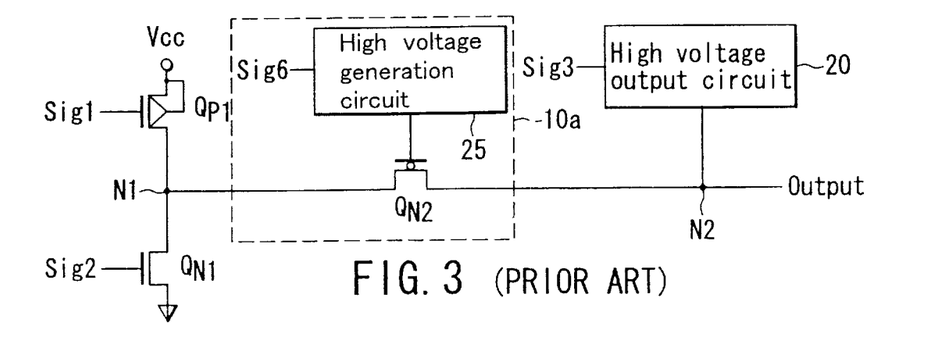
FIG. 3 shows the arrangement of a conventional voltage switching circuit using an enhancement transistor.

The circuit of FIG. 3 is a voltage switching circuit which uses a third circuit 10a that is composed of an n-channel enhancement transistor $Q_{N2}$ in place of the n-channel depletion transistor $Q_{D3}$ and a high voltage generation circuit 25 which is responsive to the signal Sig6 to provide a high voltage to the gate of $Q_{N2}$. With the use of the enhancement transistor, the threshold voltage becomes positive, which allows the circumvention of the problem of reduced margin for threshold voltage resulting from lowered supply voltage.

Figure 4:
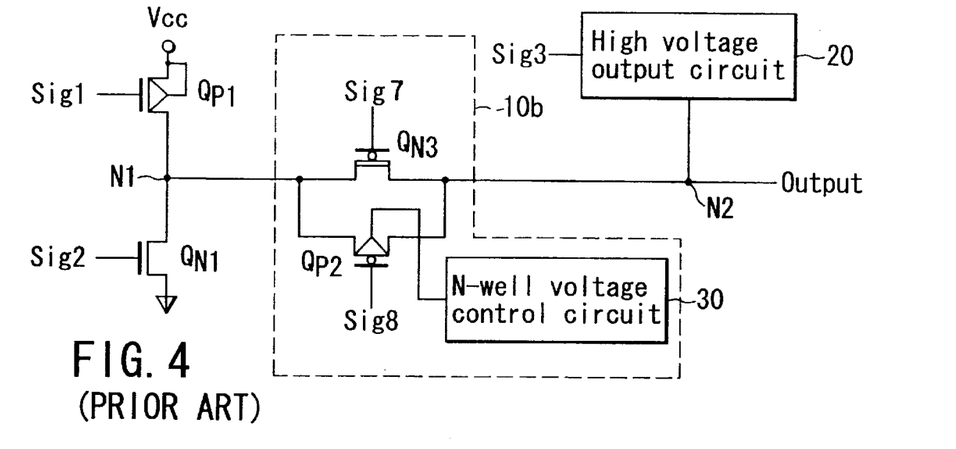
FIG. 4 shows the arrangement of another conventional voltage switching circuit using an enhancement transistor.

The circuit of FIG. 4 is a voltage switching circuit which uses as a third circuit 10b an n-channel enhancement transistor $Q_{N3}$ having its gate connected to receive a signal Sig7 in place of the depletion transistor $Q_{D3}$ and a transfer gate consisting of a p-channel enhancement transistor $Q_{P2}$ having its gate connected to receive a signal Sig8 and its substrate connected to the output of an n-well voltage control circuit 30. In the circuit shown in FIG. 4 as well, an enhancement transistor is used; thus, the threshold voltage becomes positive, allowing the circumvention of the problem of reduced margin for threshold voltage resulting from lowered supply voltage.

However, the voltage switching circuit shown in FIG. 3 is accompanied by an increase in the pattern area because of the provision of the high voltage generation circuit 25. Likewise, the pattern area of the voltage switching circuit of FIG. 4 is increased by the n-well voltage control circuit 30. Both the voltage switching circuits suffer from a significant increase in the pattern area in comparison with the circuit of FIG. 1.

As described above, the conventional voltage switching circuits for use in non-volatile semi-conductor memory devices are not allowed to use a single depletion transistor under low supply voltages because of the reduced threshold voltage margin. On the other hand, the use of an enhancement transistor to increase the threshold voltage margin is accompanied by an increase in the pattern area and consequently in the chip area.

The object of the present invention is to provide a voltage switching circuit for use in non-volatile semiconductor devices which is large in operation margin without being accompanied by an increase in the chip area.

BRIEF SUMMARY OF THE INVENTION

A voltage switching circuit according to an embodiment of the present invention is constructed from a minimum number of transistors and is adapted to prevent the threshold voltage margin from being lowered by causing high-voltage cutoff and supply voltage transfer functions heretofore performed by a single depletion transistor to be shared between two series-connected depletion transistors different in gate insulating film thickness or threshold voltage.

Specifically, a voltage switching circuit according to an embodiment of the present invention comprises: a first circuit configured to output a first voltage; a second circuit configured to output a second voltage; and a third circuit composed of a plurality transistors each having a gate insulating film and connected between the first and second circuits, the plurality of transistors comprising first and second transistors which are connected in series and have different current driving capabilities.

DETAILED DESCRIPTION OF THE INVENTION

The preferred embodiments of the present invention will be described below in detail.

[First Embodiment]

Figure 5:
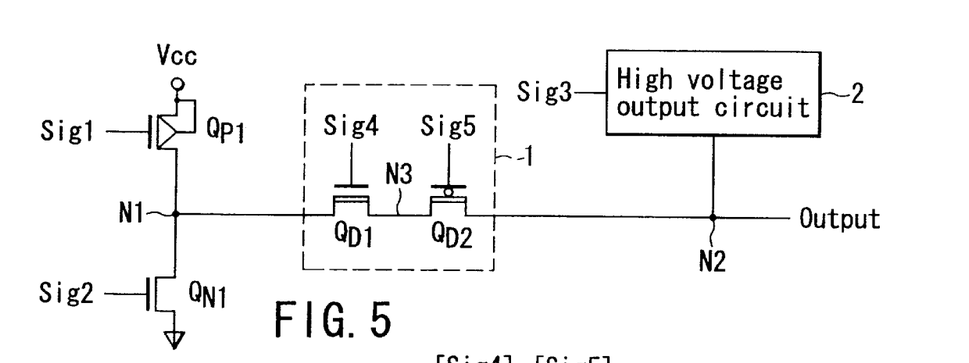
FIG. 5 shows the arrangement of a voltage switching circuit according to a first embodiment of the present invention.

FIG. 5 shows the arrangement of a voltage switching circuit according to a first embodiment of the present invention. This voltage switching circuit comprises a first circuit consisting of an enhancement P-channel transistor $Q_{P1}$ and an enhancement N-channel transistor $Q_{N1}$ which are connected together at node N1, a second circuit consisting of a high voltage output circuit 2 responsive to application of a signal Sig3 to output a high voltage $V_{PP}$, and a third circuit consisting of a depletion N-channel transistor $Q_{D1}$ having its gate connected to receive a signal Sig4 and its source connected to the node N1 and a depletion N-channel transistor $Q_{D2}$ having its gate connected to receive a signal Sig5, its source connected to the drain of $Q_{D1}$, and its drain connected to node N2.

Note here that the transistor $Q_{D2}$ has a gate insulating film thick enough to prevent breakdown thereof even with its gate, source and drain supplied with high voltages.

Next, the operation of the voltage switching circuit will be described. The first and second circuits shown in FIG. 5 remain in operation unchanged from those in FIG. 1 and hence descriptions thereof are omitted here. Unlike the third circuit 10 in FIG. 1, in the third circuit 1 in FIG. 5, the two depletion transistors $Q_{D1}$ and $Q_{D2}$ have their source-to-drain paths connected in series.

As with the signal Sig6 in FIG. 1, the signals Sig4 and Sig5 in FIG. 5 have a high level (supply voltage Vcc) and a low level (0 volts). In some cases, the high level of the signals Sig4 and Sig5 may be an arbitrary voltage # of more than 0 volts.

In the third circuit, when the signals Sig4 and Sig5 are raised to the high level, the depletion N-channel transistors $Q_{D1}$ and $Q_{D2}$ are rendered conductive, so that the path between the nodes N1 and N2 conducts. With the signals Sig4 and Sig5 at the low level, on the other hand, the transistors $Q_{D1}$ and $Q_{D2}$ are off, so that the path between the nodes N1 and N2 is cut off.

With the voltage levels of Sig1, Sig2, Sig3, Sig4 and Sig5 put in this order into brackets, the correspondence between the output voltages of the voltage switching circuit of the invention and the voltage levels of the signals Sig1 to Sig5 can be represented as follows:

(a) [Vcc, 0V, 0V, #, #]=>[high-impedance state]

(b) [Vcc, Vcc, 0V, #, #]=>[output voltage=0V]

(c) [0V, 0V, 0V, Vcc, Vcc]=>[output voltage=Vcc]

(d) [0V, 0V, Vcc, 0V, 0V]=>[output voltage=$V_{PP}$]

where # in (a) and (b) indicates that the level of the signals Sig4 and Sig5 may be any voltage as long as it is more than 0 volts.

The feature of the voltage switching circuit shown in FIG. 5 is the provision of the depletion n-channel transistors $Q_{D1}$ and $Q_{D2}$ between the node (the output node) N2 to which the high voltage $V_{PP}$ is applied and the node N1 to which voltages of Vcc or less are applied. The use of two transistors $Q_{D1}$ and $Q_{D2}$ allows voltage cutoff to be produced with ease between the node N2 to which the high voltage $V_{PP}$ is applied at the high-voltage output time and the node N1 to which the high voltage is not applied and the pattern area to be reduced in comparison with the conventional circuits shown in FIGS. 3 and 4.

Figure 6A:
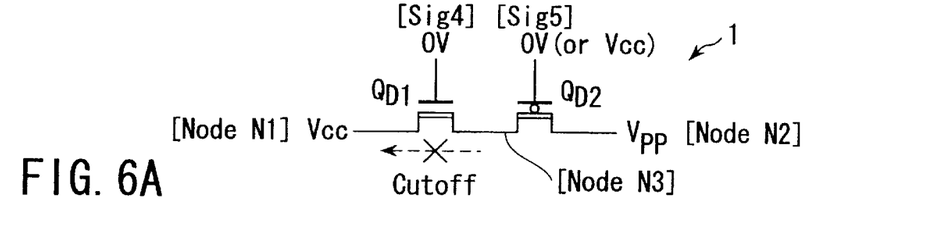
FIG. 6A is a diagram for use in explanation of the operation in the cutoff state of the third circuit in the voltage switching circuit of FIG. 5.
Figure 6B:
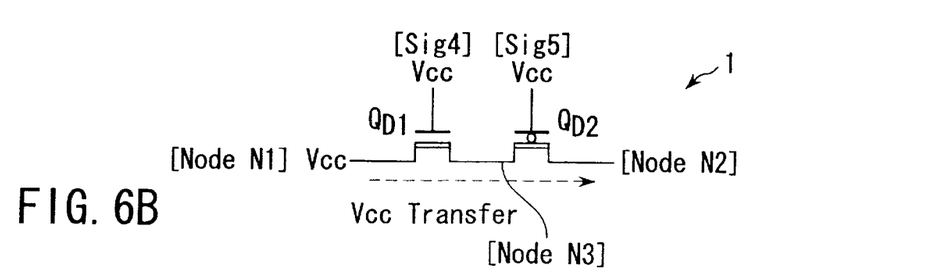
FIG. 6B is a diagram for use in explanation of the operation in the Vcc transfer state of the third circuit in the voltage switching circuit of FIG. 5.

FIGS. 6A and 6B illustrate the operation of the third circuit 1. In order for the voltage switching circuit to output desired voltages, the transistors $Q_{D1}$ and $Q_{D2}$ are required to satisfy such characteristics as indicated by broken arrows.

That is, when [Sig4, Sig5, N1, N2]=[0V, 0V, Vcc, $V_{PP}$], either of $Q_{D1}$ and $Q_{D2}$ must be cut off. When [Sig4, Sig5, N1]=[Vcc, Vcc, Vcc], the supply voltage Vcc must be transferred through $Q_{D1}$ and $Q_{D2}$ to the node N2.

In the above example, the $Q_{D1}$, $Q_{D2}$ bias condition for cutting off the path between the nodes N1 and N2 is set such that Sig4=Sig5=0V and the bias condition for allowing the transfer of Vcc between the nodes N1 and N2 is set such that Sig4=Sig5=Vcc; however, this is not restrictive.

For example, when the threshold voltage (negative value) of $Q_{D1}$ is lower than that of $Q_{D2}$ and the cutoff state and the Vcc transfer state between nodes N1 and N2 depends solely on the action of $Q_{D2}$, it is possible to set the voltage level of the signal Sig4 to the gate of $Q_{D1}$ to either 0V or Vcc for both the cutoff state and the Vcc transfer state. It is also possible to set the voltage level of the signal Sig5 to the gate of $Q_{D2}$ to either 0V or Vcc for both the cutoff state and the Vcc transfer state when the threshold voltage (negative value) of $Q_{D2}$ is lower than that of $Q_{D1}$ and the cutoff state and the Vcc transfer state between nodes N1 and N2 depends solely on the action of $Q_{D1}$. When the characteristics of the transistors $Q_{D1}$ and $Q_{D2}$ as shown in FIG. 6A are not satisfied, leakage current associated with the high voltage $V_{PP}$ will flow through $Q_{D1}$ and $Q_{D2}$, so that the level of $V_{PP}$ drops. When the characteristics of the transistors $Q_{D1}$ and $Q_{D2}$ as shown in FIG. 6B are not met, the Vcc transfer function of $Q_{D1}$ and $Q_{D2}$ fails, causing the level of output voltage Vcc to drop.

Here, a description is given of the reason why the provision of two depletion transistors $Q_{D1}$ and $Q_{D2}$ as in the inventive circuit allows both the cutoff state shown in FIG. 6A and the transfer state shown in FIG. 6B to be fulfilled easily in comparison with the case where only one depletion transistor $Q_{D3}$ is provided as in the conventional circuit.

Figure 7A:
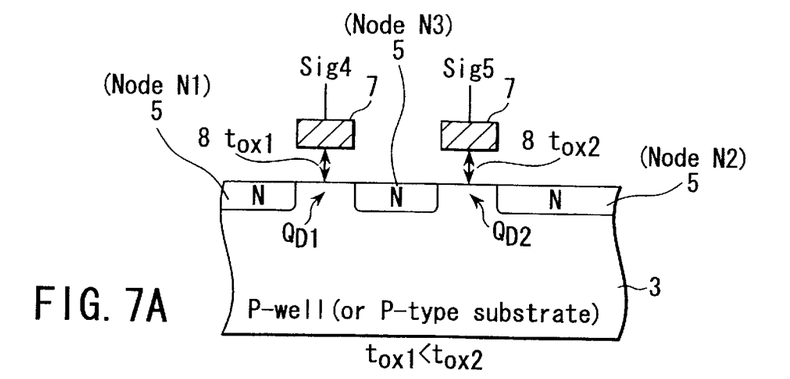
FIG. 7A is a sectional view illustrating the structure of the third circuit portion of the voltage switching circuit of the first embodiment.

FIG. 7A shows the sectional structure of the third circuit comprised of the depletion n-channel transistor $Q_{D1}$ and $Q_{D2}$ formed in a semiconductor substrate. In FIG. 7A, there are illustrated a P-well (or a P-type substrate) 3, N-type diffusion layers 5, gate electrodes 7, and gate insulating films (only their thickness is illustrated) 8. The source diffusion layer 5 of $Q_{D1}$ forms the node N1. The drain diffusion layer 5 of $Q_{D1}$ which also serves as the source diffusion layer of $Q_{D2}$ forms the node N3. The drain diffusion layer 5 of $Q_{D2}$ forms the node N2.

In the third circuit shown in FIG. 7A, the transistor $Q_{D1}$ having its gate connected to receive the signal Sig4 and the transistor $Q_{D2}$ having its gate connected to receive the signal Sig5 are formed so that their respective gate insulating films 8 have different thicknesses of tox1 and tox2. The transistor $Q_{D2}$ needs a thick gate insulating film because its drain diffusion layer 5 is connected to the node N2 to which the high voltage $V_{PP}$ is output.

However, the thickness of the gate insulating film of $Q_{D1}$ is allowed to be smaller than that of the gate insulating film of $Q_{D2}$ (i.e., tox1<tox2). This is because, since the drain diffusion layer 5 of $Q_{D1}$ is not directly connected with the node N2, and the gate of $Q_{D2}$ is at 0 volts even when the node N2 is applied with $V_{PP}$, the drain diffusion layer 5 (the node N3) of $Q_{D1}$ is only applied with a voltage of the order of the absolute value of the threshold voltage of $Q_{D2}$ (assuming the threshold voltage of $Q_{D2}$ to be −Vtd2, the voltage at node N3 is Vtd2 ($<<V_{PP}$)).

In general, a change in source-drain current with respect to a change in gate voltage, $\Delta Id/\Delta Vg$, increases with decreasing thickness of the gate insulating film. It therefore becomes easy to make the cutoff condition shown in FIG. 6A and the Vcc transfer condition shown in FIG. 6B compatible with each other. If the cutoff condition is fulfilled by $Q_{D1}$ in FIG. 7A, $Q_{D2}$ has only to fulfill the Vcc transfer condition alone. Thus, the Vcc transfer condition can be fulfilled readily by lowering the threshold voltage of $Q_{D2}$ (to a negative value large in absolute value).

For this reason, it becomes possible to provide, at low cost and at high yield, a voltage switching circuit which is large in operation margin and small in chip area without the use of the third circuit 10a or 10b having a large pattern area as shown in FIG. 3 or 4 even when a low supply voltage Vcc is used.

[Second Embodiment]

Next, a voltage switching circuit according to a second embodiment of the present invention will be described with reference to FIG. 7B, which illustrates the sectional structure of the third circuit in the second embodiment. The first and second circuits remain unchanged from those in the first embodiment and descriptions thereof are omitted.

Figure 7B:
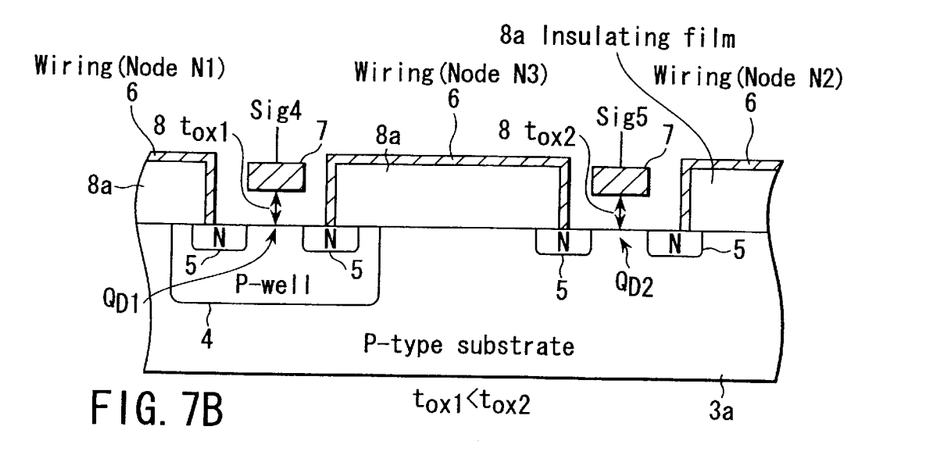
FIG. 7B is a sectional view illustrating the structure of the third circuit portion of the voltage switching circuit of a second embodiment.

The third circuit of FIG. 7B is provided with a P-type substrate 3a, a P-well formed in the P-type substrate, and N-type diffusion layers 5 formed in the P-type substrate 3a and the P-well 4.

The source diffusion layer of the depletion N-channel transistor $Q_{D1}$ formed in the P-well 4 is connected with node N1 using a wiring 6. The drain diffusion layer 5 of $Q_{D1}$ is connected with the source diffusion layer of the depletion N-channel transistor $Q_{D2}$ formed in the P-type substrate 3a using a wiring 6 forming node N3. The drain diffusion layer 5 of $Q_{D2}$ is connected to node N2 using a wiring 6.

Other portions remain the same as in the first embodiment and descriptions thereof are thus omitted. The surface of the semiconductor substrate is covered with an insulating film 8a except areas where the wirings 6 make contact with the diffusion layers 5.

The depletion transistors $Q_{D1}$ and $Q_{D2}$ need not necessarily be formed in the same well or substrate but may be formed in a different well or substrate as shown in FIG. 7B. In this case as well, by setting $Q_{D1}$ and $Q_{D2}$ such that tox1<tox2 is the thickness of the gate insulating film, the cutoff condition and the Vcc transfer condition can be made compatible with each other as in the case of FIG. 7A.

[Third Embodiment]

Next, a voltage switching circuit according to a third embodiment of the present invention will be described with reference to FIG. 7C, which illustrates the sectional structure of the third circuit in the third embodiment. The sectional structure of FIG. 7C is the same as that in FIG. 7A except that tox1=tox2 and a description of the structure is thus omitted.

Figure 7C:
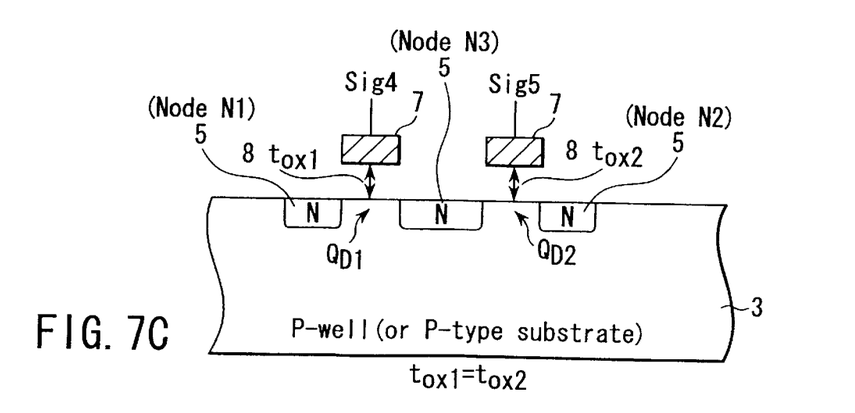
FIG. 7C is a sectional view illustrating the structure of the third circuit portion of the voltage switching circuit of a third embodiment.

In the third circuit of FIG. 7C, $Q_{D1}$ and $Q_{D2}$ are formed to have gate insulating films of equal thickness (tox1=tox2) but have different threshold voltages as a result of changing channel ion implantation conditions. The provision of a degree of freedom in setting the threshold voltages of $Q_{D1}$ and $Q_{D2}$ results in a high degree of freedom in the voltage at the node N3. Thus, the cutoff condition and the Vcc transfer condition can be made compatible with each other with ease in comparison with the prior arts.

[Fourth Embodiment]

Figure 7D:
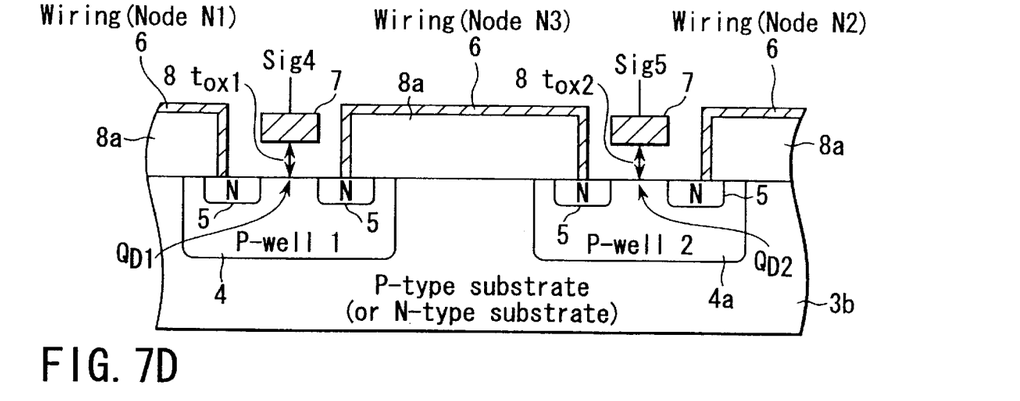
FIG. 7D is a sectional view illustrating the structure of the third circuit portion of the voltage switching circuit of a fourth embodiment.

Next, a voltage switching circuit according to a fourth embodiment of the present invention will be described with reference to FIG. 7D, which illustrates the sectional structure of the third circuit in the fourth embodiment. The sectional structure of FIG. 7D is the same as that in FIG. 7B except that the transistors $Q_{D1}$ and $Q_{D2}$ are formed in P-well 1 (4) and P-well 2 (4a), respectively, in a P-type substrate (or N-type substrate) 3b and a further description of the structure is thus omitted.

In general, the lower the impurity concentration of a well or substrate in which a transistor is formed, the greater the change in source-drain current with respect to change in gate voltage, $\Delta Id/\Delta Vg$, becomes. For this reason, by setting the impurity concentration of the P-well 2 (4a) in which the transistor $Q_{D1}$ is formed higher or lower than that of the P-well 1 (4), the degree of freedom in combination of threshold voltages of transistors can be increased; thus, it becomes easy to make the cutoff condition and the Vcc transfer condition compatible with each other.

Particularly when P-well 1<P-well 2 in impurity concentration, $\Delta Id/\Delta Vg$ of $Q_{D1}$ can be made greater than when P-well 1=P-well 2. Thus, the cutoff condition and the Vcc transfer condition can easily be made compatible with each other for $Q_{D1}$.

[Fifth Embodiment]

Next, a voltage switching circuit according to a fifth embodiment of the present invention will be described with reference to FIG. 7E, which illustrates the sectional structure of the third circuit in the fifth embodiment. The sectional structure of FIG. 7E is the same as that in FIG. 7B except that the transistor $Q_{D1}$ is formed in the P-type substrate 3a and the transistor $Q_{D2}$ is formed in P-well 2 (4a) in the P-type substrate 3a and a further description of the structure is thus omitted.

Figure 7E:
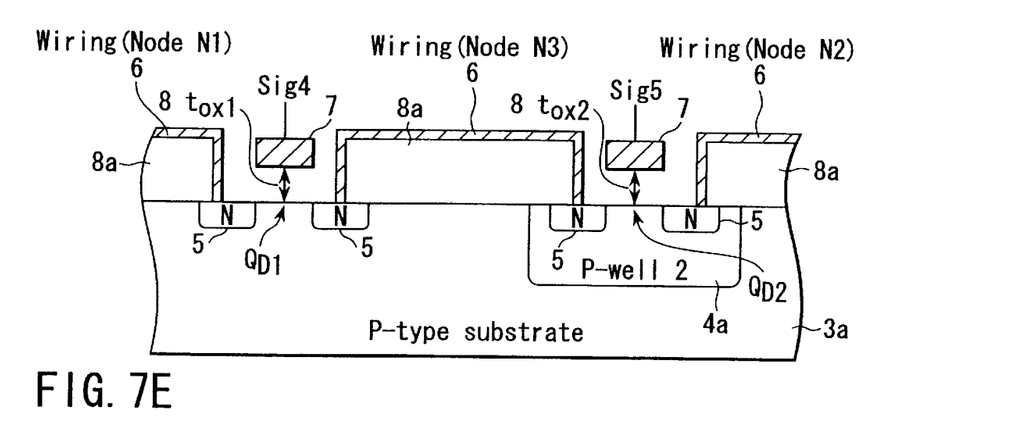
FIG. 7E is a sectional view illustrating the structure of the third circuit portion of the voltage switching circuit of a fifth embodiment.

Even when only $Q_{D1}$ is formed in the P-type substrate and $Q_{D2}$ is formed in the P-well as shown in FIG. 7E, the impurity concentration of the P-type substrate is usually lower that of the P-well, allowing easy fulfillment of the cutoff condition and the Vcc transfer condition through $Q_{D1}$ as in the case of FIG. 7D. Even if $Q_{D1}$ and $Q_{D2}$ have their gate insulating film set such that tox1=tox2 in the fourth and fifth embodiments, a significant improvement will be made over the conventional circuit shown in FIG. 1. With tox1<tox2, a still further improvement will be obtained owing to the combined effect of the impurity concentration and the gate insulating film thickness.

In the first through fifth embodiments described in conjunction with FIGS. 5 through 7, basically each of the first and second depletion transistor $Q_{D1}$ and $Q_{D2}$ has its own function. That is, the transistor $Q_{D1}$ serves the function of making the cutoff condition and the Vcc transfer condition between the nodes N1 and N2 compatible with each other, and the transistor $Q_{D2}$ serves the function of fulfilling only the Vcc transfer condition while causing the maximum of the voltage level transferred to node N3 to fall below $V_{PP}$.

[Sixth Embodiment]

Next, a method of manufacturing the depletion transistors $Q_{D1}$ and $Q_{D2}$ will be described as a sixth embodiment of the present invention. In general, in fabricating a transistor, impurities are ion implanted into the channel portion of that transistor in order to set its threshold voltage to a desired value. This process is referred hereinafter to as the channel ion implantation. In many cases, the channel ion implantation is performed separately on each of transistors that are to have different threshold voltages Vt. Thus, as many channel ion implantation masks as there are types of transistors are needed. The fewer the masks, the lower the chip manufacturing cost becomes.

As described previously, in the present invention the first depletion transistor $Q_{D1}$ is intended to make the cutoff condition and the Vcc transfer condition between nodes N1 and N2 compatible with each other and the second depletion transistor $Q_{D2}$ is intended to fulfill the Vcc transfer condition alone; therefore, it is desirable that the threshold voltage of $Q_{D2}$ be relatively low (particularly lower than the threshold voltage of $Q_{D1}$; i.e., $Vt(Q_{D1})>Vt(Q_{D2})$).

When, as shown in FIG. 7A, $Q_{D1}$ and $Q_{D2}$ are formed in the same well (or the same substrate) and their gate insulating film thickness is set such that tox1<tox2, if $Q_{D1}$ and $Q_{D2}$ are subjected to the same channel ion implantation process, then the absolute value of the threshold voltage ($V_{td1}$) of $Q_{D1}$ will usually become smaller than that of the threshold voltage ($V_{td2}$) of $Q_{D2}$ (Vtd1<Vtd2); thus, Vt($Q_{D1}$)=−Vtd1>Vt($Q_{D2}$)=−Vtd2. It therefore becomes possible to subject $Q_{D1}$ and $Q_{D2}$ to the same channel ion implantation process.

Thus, when $Q_{D1}$ and $Q_{D2}$ have their gate insulating film thickness related such that tox1<tox2, by making the channel ion implantation process common to $Q_{D1}$ and $Q_{D2}$, the masks and the manufacturing processes can be reduced in number, allowing the chip manufacturing cost to be reduced. In the structures of FIGS. 7B, 7D and 7E as well, the transistors $Q_{D1}$ and $Q_{D2}$ may be subjected to the same channel ion implantation process with the same effect as in the case of FIG. 7A.

[Seventh Embodiment]

Next, a voltage switching circuit according to a seventh embodiment of the present invention will be described with reference to FIG. 8. As the seventh embodiment a description is given of a modification of the voltage switching circuit of the first embodiment.

Figure 8:
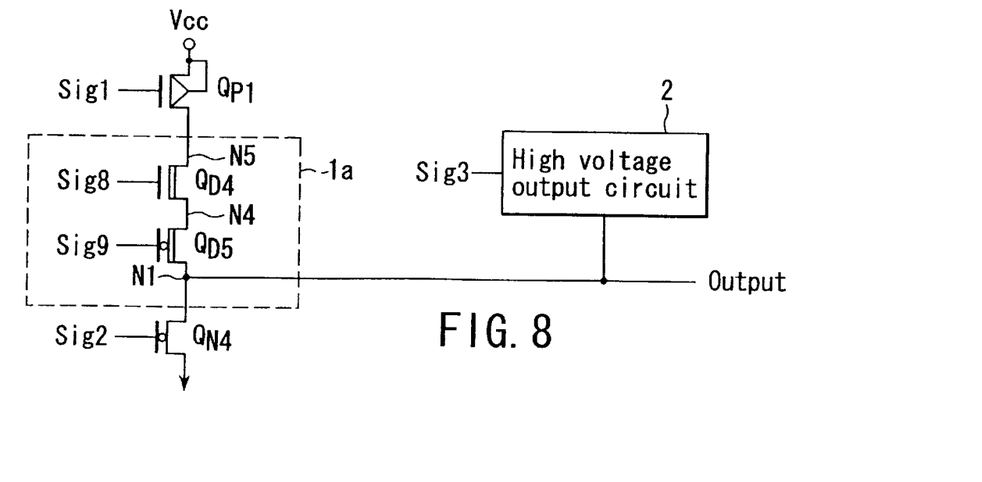
FIG. 8 shows the arrangement of a voltage switching circuit according to a seventh embodiment of the present invention.

In the voltage switching circuit shown in FIG. 8, a third circuit 1a consisting of depletion N-channel transistors $Q_{D4}$ and $Q_{D5}$ is connected between the node N1 and the enhancement P-channel transistor $Q_{P1}$ in the first circuit in the first embodiment shown in FIG. 5.

In this circuit, $V_{PP}$ from the second high-voltage output circuit in the first embodiment is directly output to node N1 and at most, the supply voltage Vcc (<<$V_{PP}$) is merely applied to node N5 between the transistors $Q_{P1}$ and $Q_{D4}$; therefore, the gate insulating film of $Q_{D4}$ connected to node N5 is made smaller in thickness than that of $Q_{D5}$ connected to node N1. Input signals Sig8 and Sig9 are applied to the gates of $Q_{D4}$ and $Q_{D5}$, respectively. The correspondence between the voltage levels of the respective input signals [Sig1, Sig2, Sig3, Sig8, Sig9] and the output voltages is represented as follows:

(a) [Vcc, 0V, 0V, #, #]=>[high-impedance state]
(b) [Vcc, Vcc, 0V, #, #]=>[output voltage=0V]
(c) [0V, 0V, 0V, Vcc, Vcc]=>[output voltage=Vcc]
(d) [0V, 0V, Vcc, 0V, 0V]=>[output voltage=$V_{PP}$]

The outputs in (a) to (d) remain unchanged from those in the first embodiment.

Thus, the voltage switching circuit of the seventh embodiment has the same function as the voltage switching circuit of the first embodiment. However, since the high voltage $V_{PP}$ is output to the node N1, the enhancement N-channel transistor $Q_{N4}$ should have its gate insulating film set to substantially the same thickness as $Q_{D5}$.

[Eighth Embodiment]

Next, a voltage switching circuit according to an eighth embodiment of the present invention will be described with reference to FIG. 9. As the eighth embodiment a description is given of a modification of the voltage switching circuit of the seventh embodiment.

Figure 9:
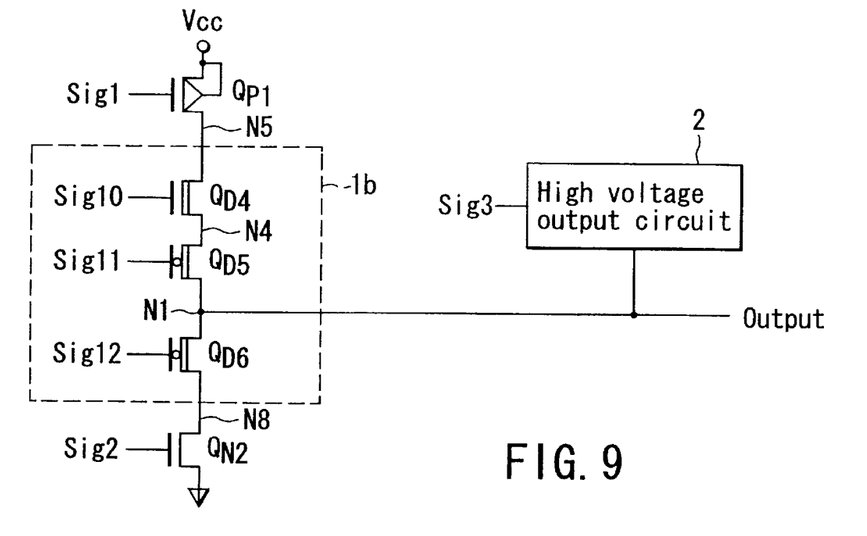
FIG. 9 shows the arrangement of a voltage switching circuit according to an eighth embodiment of the present invention.

In the voltage switching circuit of the eighth embodiment shown in FIG. 9, a depletion N-channel transistor $Q_{D6}$ is further connected between the node N1 and the enhancement N-channel transistor $Q_{N4}$ in the seventh embodiment shown in FIG. 8. In FIG. 9, the portion corresponding to the transistor circuit 1a in FIG. 8 is indicated as a transistor circuit 1b.

In the transistor circuit 1b of FIG. 9, not only are two depletion N-channel transistors QD4 and QD5, adapted to improve the $V_{PP}$ cutoff condition and the Vcc transfer condition, connected between the nodes N1 and N5, but a single depletion n-channel transistor $Q_{D6}$ adapted to improve the $V_{PP}$ cutoff condition is also connected between the nodes N1 and N8.

In this circuit, the node N1 is directly supplied with $V_{PP}$ from the second high-voltage output circuit in the first embodiment and the node N5 is merely supplied with, at a maximum, the supply voltage Vcc (<<$V_{PP}$); therefore, the gate insulating film of $Q_{D4}$ connected to the node N5 is made smaller in thickness than that of $Q_{D5}$ and $Q_{D6}$ connected to the node N1. Input signals Sig10 and Sig11 are applied to the gates of $Q_{D4}$ and $Q_{D5}$, respectively, and an input signal Sig12 is applied to the gate of $Q_{D6}$. The correspondence between the voltage levels of the respective input signals [Sig1, Sig2, Sig3, Sig10, Sig11, Sig12] and the output voltages is represented as follows:

(a) [Vcc, 0V, 0V, #, #, #]=>[high-impedance state]
(b) [Vcc, Vcc, 0V, #, #, #]=>[output voltage=0V]
(c) [0V, 0V, 0V, Vcc, Vcc, #]=>[output voltage=Vcc]
(d) [0V, 0V, Vcc, 0V, 0V, 0V]=>[output voltage=$V_{PP}$]

The outputs in (a) to (d) remain unchanged from those in the seventh embodiment.

Thus, the voltage switching circuit of the eighth embodiment has the same function as the voltage switching circuit of the seventh embodiment. However, since the high voltage $V_{PP}$ is output to the node N1, the depletion N-channel transistor $Q_{D6}$ should have its gate insulating film set to substantially the same thickness as $Q_{D5}$. Instead, $Q_{N2}$ is allowed to have substantially the same gate insulating film thickness as $Q_{N1}$ in FIG. 5.

[Ninth Embodiment]

Next, a voltage switching circuit according to a ninth embodiment of the present invention will be described with reference to FIG. 10. As the ninth embodiment a description is given of a modification of the voltage switching circuit of the eighth embodiment.

Figure 10:
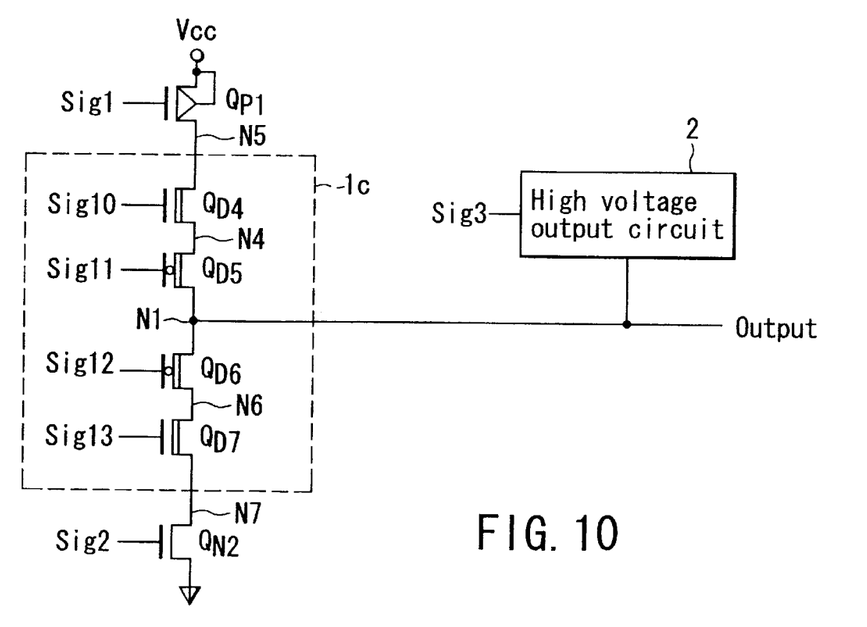
FIG. 10 shows the arrangement of a voltage switching circuit according to a ninth embodiment of the present invention.

In the voltage switching circuit of the ninth embodiment shown in FIG. 10, a depletion N-channel transistor $Q_{D7}$ is further connected between the depletion N-channel transistor $Q_{D6}$ and the enhancement N-channel transistor $Q_{N2}$ in the eighth embodiment shown in FIG. 9. In FIG. 10, the portion corresponding to the transistor circuit 1b in FIG. 9 is indicated as a transistor circuit 1c.

In the transistor circuit 1c of FIG. 10, not only are two depletion N-channel transistors $Q_{D4}$ and $Q_{D5}$, adapted to improve the $V_{PP}$ cutoff condition and the Vcc transfer condition, connected between the nodes N1 and N5, but two depletion N-channel transistor $Q_{D6}$ and $Q_{D7}$ adapted to improve the $V_{PP}$ cutoff condition and the Vcc transfer condition are also connected between the nodes N1 and N7.

In this circuit, the node N1 is directly supplied with $V_{PP}$ from the second high-voltage output circuit in the first embodiment and the node N5 is merely supplied with, at a maximum, the supply voltage Vcc (<<$V_{PP}$); therefore, the gate insulating film of $Q_{D4}$ connected to the node N5 is made smaller in thickness than that of $Q_{D5}$ and $Q_{D6}$ connected to the node N1. Likewise, the gate insulating film of $Q_{D7}$ connected to the node N7 is made smaller in thickness than that of $Q_{D5}$ and $Q_{D6}$.

Input signals Sig10 and Sig11 are applied to the gates of $Q_{D4}$ and $Q_{D5}$, respectively, and input signals Sig12 and Sig13 are applied to the gates of $Q_{D6}$ and $Q_{D7}$, respectively. The correspondence between the voltage levels of the respective input signals [Sig1, Sig2, Sig3, Sig10, Sig11, Sig12, Sig13] and the output voltages is represented as follows:

(a) [Vcc, 0V, 0V, #, #, #, #]=>[high-impedance state]
(b) [Vcc, Vcc, 0V, #, #, #, #]=>[output voltage=0V]
(c) [0V, 0V, 0V, Vcc, Vcc, #, #]=>[output voltage=Vcc]
(d) [0V, 0V, Vcc, 0V, 0V, 0V, 0V]=>[output voltage=$V_{PP}$]

The outputs in (a) to (d) remain unchanged from those in the eighth embodiment.

Thus, the voltage switching circuit of the ninth embodiment has the same function as the voltage switching circuit of the eighth embodiment. Since the high voltage $V_{PP}$ is output to the node N1 as in the eighth embodiment, the depletion N-channel transistor $Q_{D6}$ has its gate insulating film set to substantially the same thickness as $Q_{D5}$.

The ninth embodiment is larger in the number of transistors used than the seventh and eighth embodiments. In the ninth embodiment, however, since two depletion transistors are used not only between the nodes N1 and N5 on the Vcc side but also between the nodes N1 and N7 on the ground side, the $V_{PP}$ cutoff condition and the Vcc transfer condition can be optimized. Accordingly, a voltage switching circuit can be provided which operates stably with a low supply voltage Vcc.

[Tenth Embodiment]

Next, voltage switching circuits according to a tenth embodiment of the present invention will be described with reference to FIGS. 11 and 12. The voltage switching circuit shown in FIG. 11 is arranged such that only the upper portion of the circuit of FIG. 10 between the node N1 and Vcc is connected to the node N1, whereas The voltage switching circuit shown in FIG. 11 is arranged such that only the lower portion of the circuit of FIG. 10 between the node N1 and ground is connected to the node N1.

Figure 11:
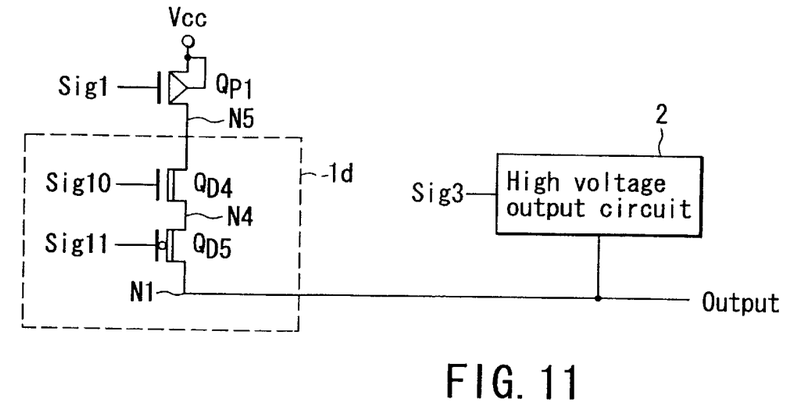
FIG. 11 shows the arrangement of a voltage switching circuit according to a tenth embodiment of the present invention.
Figure 12:
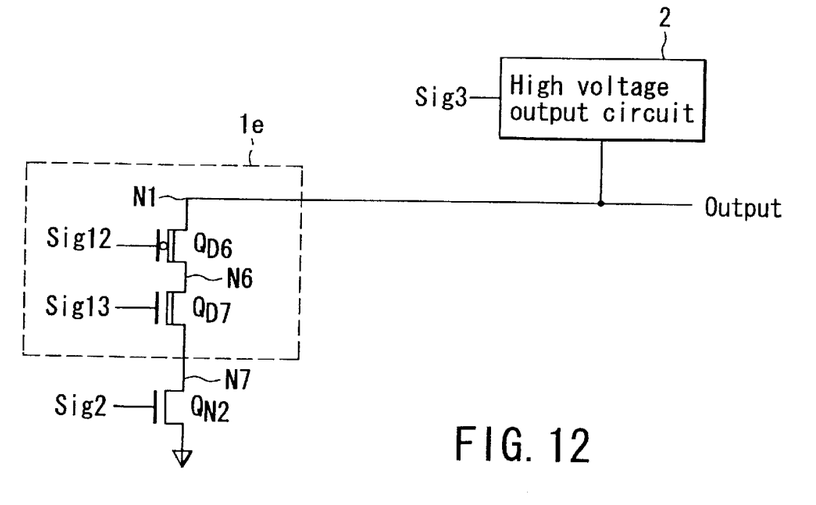
FIG. 12 shows a modification of the tenth embodiment.

From the description of FIG. 10 it is evident that the output of the voltage switching circuit of FIG. 11 is at Vcc, $V_{PP}$, or in the high-impedance state, while the output of the voltage switching circuit of FIG. 12 is at 0 volts, $V_{PP}$, or in the high-impedance state. Depending on the circuit arrangement of semiconductor devices to which the present invention is applied, a voltage level of Vcc or ground may not be required. In such a case, the voltage switching circuits of the tenth embodiment will be effective.

The present invention is not limited to the embodiments described so far. For example, although the embodiments have been described as one node of the third circuit being applied with the high voltage $V_{PP}$ and the other node being applied with voltages of less than the supply voltage Vcc, this is not restrictive. The present invention is also effective in the case where the other node is applied with an intermediate voltage Vm (Vcc<Vm<$V_{PP}$).

In the first through fourth embodiments, descriptions have been given of the arrangement of series connection of multiple depletion transistors having gate insulating films different in thickness, the manufacture of the depletion transistors under the same channel ion implantation conditions, and the formation of the depletion transistors in different wells or a well and a substrate. The invention is not limited to the use of depletion transistors. Those arrangement and process can be equally applied to enhancement transistors.

Figure 13:
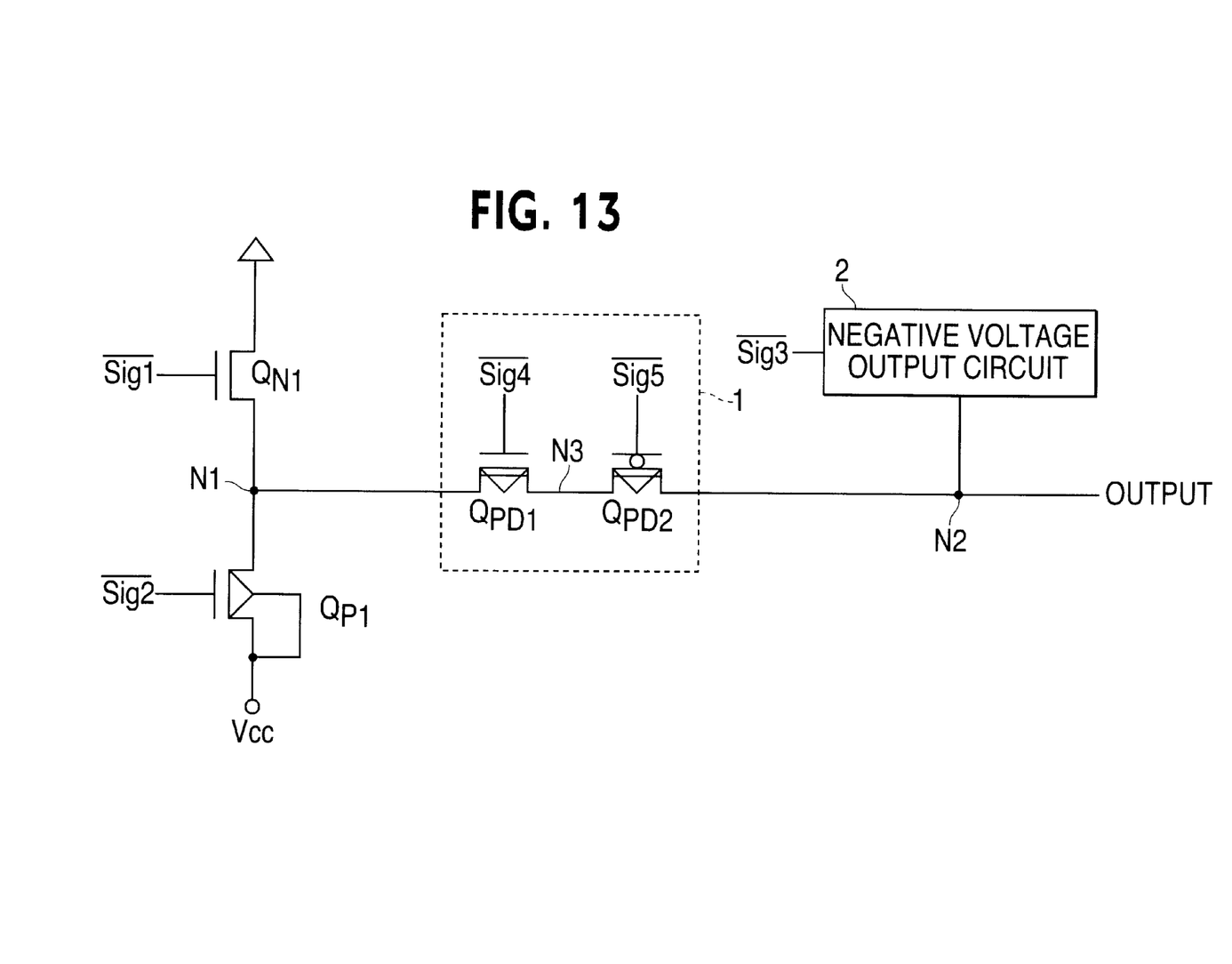
FIG. 13 shows the arrangement of a voltage switching circuit according to another embodiment of the present invention.

In the above voltage switching circuits, even if the conductivity type (polarity) of constituent elements used is reversed, the same circuit function can be implemented. For example, the function of the third circuit shown in FIG. 5 may be implemented with two depletion P-channel transistors $Q_{PD1}$ and $Q_{PD2}$ as illustrated in a further embodiment depicted in FIG. 13. In such a configuration, the polarities of the voltages are inverted from the corresponding voltages of FIG. 5. More specifically, signals Sig1 to Sig5 are changed to inverted signals /Sig1 to /Sig5, whereas the high voltage output circuit is changed to a negative voltage output circuit. The Vcc and GND terminals are exchanged in positions. In the above embodiments, the function of the third circuit that is composed basically of two depletion transistors that are series connected has been mainly described; however, three or more depletion transistors may be used to implement the same function. The present invention may be practiced or embodied in still other ways without departing from the scope and sprit thereof.

According to the present invention, as described above, voltage switching circuits adapted for nonvolatile semiconductor storage devices can be provided which, even if the supply voltage used is low, allow the operation margin to be large with no increase in chip area.

What is claimed is:

1. A voltage switching circuit comprising:
   a first circuit configured to output a first voltage;
   a second circuit configured to output a second voltage; and
   a third circuit composed of a plurality of transistors each having a gate insulating film and connected between said first and second circuits, said plurality of transistors comprising first and second transistors which are connected in series and have different current driving capabilities, wherein both of said first and second transistors are depletion-type transistors.

2. The voltage switching circuit according to claim 1, wherein a thickness of the gate insulating film of said first transistor differs from a thickness of the gate insulating film of said second transistor.

3. The voltage switching circuit according to claim 1, wherein said first transistor is formed in a first well, said second transistor is formed in a second well and said first and second wells are of the same polarity.

4. The voltage switching circuit according to claim 3, wherein a thickness of the gate insulating film of said first transistor differs from a thickness of the gate insulating film of said second transistor.

5. The voltage switching circuit according to claim 3, wherein said first well is separate from said second well.

6. The voltage switching circuit according to claim 1, wherein one of said first and second transistors is formed in a semiconductor substrate and the other is formed in a well of the same polarity as said semiconductor substrate.

7. The voltage switching circuit according to claim 5, wherein a thickness of the gate insulating film of said first transistor differs from a thickness of the gate insulating film of said second transistor.

8. The voltage switching circuit according to claim 1, wherein said first and second transistors are different in threshold voltage.

9. The voltage switching circuit according to claim 1, wherein each of said first and second transistors is subjected to a different channel ion implantation process.

10. The voltage switching circuit according to claim 1, wherein said first and second transistors are subjected to the same channel ion implantation process.

11. The voltage switching circuit according to claim 10, wherein a thickness of the gate insulating film of said first transistor differs from a thickness of the gate insulating film of said second transistor.

12. The voltage switching circuit according to claim 1, wherein said first and second transistors are N-channel transistors, or said first and second transistors are P-channel transistors.

13. The voltage switching circuit according to claim 12, wherein a thickness of the gate insulating film of said first transistors differs from a thickness of the gate insulating film of said second transistor.

14. The voltage switching circuit according to claim 12, wherein said first and second transistors are different in threshold voltage.

15. The voltage switching circuit according to claim 1, wherein said second voltage is higher than said first voltage and a power supply voltage.

16. The voltage switching circuit according to claim 15, wherein said first voltage is equal to said power supply voltage, or said first voltage is less than said power supply voltage.

17. The voltage switching circuit according to claim 16, wherein said second transistor is arranged on said second circuit side and the gate insulating film of said second transistor is thicker than the gate insulating film of said first transistor.

18. The voltage switching circuit according to claim 16, wherein said second transistor is arranged on said second circuit side and is lower in threshold voltage than said first transistor.

19. The voltage switching circuit according to claim 16, wherein a thickness of the gate insulating film of said first transistors differs from a thickness of the gate insulating film of said second transistor.

20. The voltage switching circuit according to claim 16, wherein said first and second transistors are different from each other in threshold voltage.

21. The voltage switching circuit according to claim 16, wherein each of said first and second transistors is subjected to a different channel ion implantation process.

22. The voltage switching circuit according to claim 16, wherein said first and second transistors are subjected to the same channel ion implantation process.

23. The voltage switching circuit according to claim 1, wherein said first transistor has at least one first gate electrode, and said second transistor has at least one second gate electrode separate from said first gate electrode.

24. The voltage switching circuit according to claim 1, wherein said first and second transistors are formed in a well.

25. The voltage switching circuit according to claim 24, wherein a thickness of the gate insulating film of said first transistor differs from a thickness of the gate insulating film of said second transistor.

* * * * *